United States Patent
Chen

[11] Patent Number: 5,972,775
[45] Date of Patent: Oct. 26, 1999

[54] METHOD OF INCREASING THICKNESS OF FIELD OXIDE LAYER

[75] Inventor: Han-Ping Chen, Hsinchu, Taiwan

[73] Assignee: Holtek Semiconductor Inc., Hsinchu, Taiwan

[21] Appl. No.: 09/059,908

[22] Filed: Apr. 13, 1998

[30]    Foreign Application Priority Data

Jul. 8, 1997 [TW]  Taiwan .................................. 86109561

[51] Int. Cl.⁶ .................................................. H01L 21/762
[52] U.S. Cl. ............................................................. 438/439
[58] Field of Search .................... 438/439, 444, 438/448, 449, FOR 229

[56]         References Cited
         U.S. PATENT DOCUMENTS 5,851,901   12/1998   Gardner et al. .

*Primary Examiner*—George Fourson
*Attorney, Agent, or Firm*—W. Wayne Liauh

[57]             ABSTRACT

A method for increasing the thickness of field oxide layer is provided. At first, a layer of pad oxide and a layer of silicon nitride mask are defined on a semiconductor substrate, and then a field oxide layer, which isolates active device regions, is formed. After the layer of pad oxide and the layer of silicon nitride are removed, a layer of silicon oxide is formed overlying the field oxide layer. The mentioned silicon oxide layer can increase the thickness of field oxide layer for effectively isolating active device regions without enlarging Bird's Beak. The present invention can also effectively improve the Gate Coupling Ratio in a Flash EEPROM.

12 Claims, 3 Drawing Sheets

METHOD OF INCREASING THICKNESS OF FIELD OXIDE LAYER

BACKGROUND OF THE INVENTION (1) Field of the Invention

The present invention relates generally to a method of forming a thick field oxide layer of a semiconductor substrate, and more particularly to a method of increasing the thickness of the field oxide layer by forming a silicon dioxide on the field oxide layer. The invention is illustrated in an example with regard to a method of increasing the thickness of the field oxide layer to improve the Gate Coupling Ratio (GCR) with regard to the manufacture of a Read Only Memory (ROM), more particularly to the manufacture of a Flash Electrically Erasable Programmable Read Only Memory (Flash EEPROM).

(2) Description of the Prior Art

A microcircuit can be described as an "ensemble of active and passive components, interconnected within a monolithic block of semiconductor material." Thus the first requirement is to devise schemes for fabricating components that are electrically isolated from each other in order to allow design flexibility. One of the numerous different approaches been in use today is the localized oxidation of silicon (LOCOS) which is specific to silicon microcircuits. In the LOCOS process, a field oxide layer is formed onto a silicon substrate. The field oxide layer can isolate components from each other for their independent operation.

In general, the field oxide layer is formed at exposed regions of a silicon substrate by using a method of thermal oxidation. One of the technological problems which arise during the application of LOCOS is "bird's beak", which is a lateral extension of the field oxide into the active area of the device. This effect leads to predictions that LOCOS isolation would decrease the active area of the device and increase difficulties in the semiconductor processing.

The thicker the field oxide is, the better the isolation between devices is. However, one of the parameters upon which the length of the bird's beak depends is the thickness of the isolation field oxide. Therefore, increasing the thickness of isolation field oxide without limiting the size or area of the active device regions can not only improve the isolation between devices but also increase the range of applications on a Read Only Memory (ROM).

In the fabrication of a ROM, particularly an EEPROM, it is often necessary to fabricate a storage cell that retains data after the applied power is turned off, that is, a storage cell having almost permanent data characteristics. The storage cells are generally mass data storage files where each cell corresponds to the presence or absence of a stored charge on a floating gate of a storage cell transistor. Specifically, the storage cell includes at least two conducting layers, i.e., one conducting layer is the control gate for control of the cell operation. The floating gate is formed on a thin gate oxide formed on the substrate. The control gate is located above the floating gate, and the control gate and floating gate are isolated from each other by a thin dielectric layer known as an "interpoly oxide", which may typically be composed of oxide/nitride/oxide (ONO). In some typical EEPROMs, data is programmed into the cells by applying a high voltage to the control gate to inject hot electrons (or tunnel electrons in some devices) into the floating gate. The process of programming data is often called coding. In coding, the charge is transferred from the silicon substrate through the thin gate oxide layer to the floating gate. The interface area A2 (FIG. 1) between the floating gate and the control gate are related to the Gate Coupling Ratio (GCR) of the EEPROM. A larger interface area between floating gate and control gate can get a higher the Gate Coupling Ratio (GCR) of the EEPROM. Thus, the required voltage of driving electrons for programming and erasing data would be lowered.

In EEPROMs, especially for flash EEPROMs, it is generally critical to grow a high-quality, thin gate oxide (used as a tunneling oxide) in the storage cell and (used as a thin gate oxide) in some transistors in the periphery of the storage cell region in order to provide high driving capability for higher speed. Controlling the thickness of the thin gate oxide is crucial, especially since design rules for devices with gates are becoming increasingly smaller and require thinner gate oxides. Because high-voltage supplies are used, thicker gate oxides at the periphery of the storage cell region are needed to maintain device quality and reliability after long-term high voltage stress from the high voltage (e.g., up to or greater than ±12 V) generated through a pumping circuit for storage cell coding and/or erase. Therefore, implementing larger field oxide thickness in EEPROM devices is an important aspect of the fabrication of high performance devices.

FIG. 1 shows a cross-section view of an EEPROM structure formed according to conventional steps. The EEPROM is made using a LOCOS process. The field isolation oxide layer is generally made by forming a thickness of silicon dioxide 111 using an oxidation process, i.e., thermal treatment, overlying a silicon substrate 101. Each of the isolation structures includes active device regions between the isolation structures. Next, a thickness of silicon dioxide (not shown), which is made for a gate oxide layer, is formed on the surface of the active device regions using an oxidation process. A first polysilicon layer 131 as the floating gate of the ROM is formed onto the gate oxide layer. Then, a second polysilicon layer 141 as the control gate of the ROM is formed overlying the field oxide 111 and the first polysilicon layer 131.

Referring to FIG. 1, the interface area A2 between the first polysilicon layer 131 and the second polysilicon layer 141 depends upon the surface area of the first polysilicon layer 131. If the thickness of the field oxide layer 111 is increased but the length of the field oxide 111, then A2 can be increased effectively and the interface area A1 between gate oxide and silicon substrate can be maintained. Thus, the Gate Coupling Ratio (GCR) of the EEPROM would be improved without enlarging bird's beak, and the operating voltage of the EEPROM would be lowered.

From the above, it is seen that the technique of the present invention for improving the isolation between integrated circuit devices by increasing the thickness of field oxide layer and simultaneously increasing the GCR to lower the operation voltage of devices is highly desired.

SUMMARY OF THE INVENTION

The present invention seeks to provide a method of increasing the thickness of field oxide layer without limiting the size or area of the active device regions, which avoids the long bird's beak and effectively isolates electrical devices in semiconductor integrated circuits.

The present invention also seeks to provide a method of increasing the Gate Coupling Ratio (GCR) of a Read Only Memory (ROM), particularly of a Flash Electrically Erasable Programmable Read Only Memory (Flash EEPROM) by increasing the interface area between the floating gate and the control gate.

According to one aspect of the present invention, there is provided a method of increasing the thickness of field oxide layer, comprising: providing a starting semiconductor substrate; forming a pad oxide layer onto the starting semiconductor substrate; depositing a silicon nitride mask overlying the pad oxide layer; patterning the silicon nitride mask and the pad oxide layer to define isolation regions by using a first photoresist; thereby selectively removing the patterned silicon nitride mask and the pad oxide layer; forming a field oxide layer at said isolation regions by thermal oxidation process; removing the silicon nitride mask and the pad oxide layer; forming a layer of silicon dioxide overlying said field oxide layer and the exposed regions on the substrate; patterning the layer of silicon dioxide by using a second photoresist; and removing the patterned layer of silicon dioxide thereby increasing the thickness of said field oxide layer.

According to another aspect of the present invention, there is providing a method of increasing the thickness of field oxide layer, comprising: providing a starting semiconductor substrate; forming a pad oxide layer onto the starting semiconductor substrate; depositing a silicon nitride mask overlying the pad oxide layer; patterning the silicon nitride mask and the pad oxide layer to define isolation regions by using a first photoresist; thereby selectively removing said patterned silicon nitride mask and said pad oxide layer; forming a field oxide layer at the isolation regions by thermal oxidation process; forming a layer of silicon dioxide overlying the field oxide layer and the silicon nitride mask; patterning the layer of silicon dioxide by using a second photoresist; removing said patterned layer of silicon dioxide thereby increasing the thickness of said field oxide layer; and removing the silicon nitride mask and the pad oxide layer.

DETAILED DESCRIPTION OF THE PREFERRED EMBODIMENT

In the following description, numerous details are set forth in order to provide a thorough understanding of the present invention. The invention is illustrated in an example with regard to the manufacture of a ROM cell, and more particularly to the manufacture of an EEPROM cell, but it will be realized that the invention has a wider range of applicability.

Figure 2:
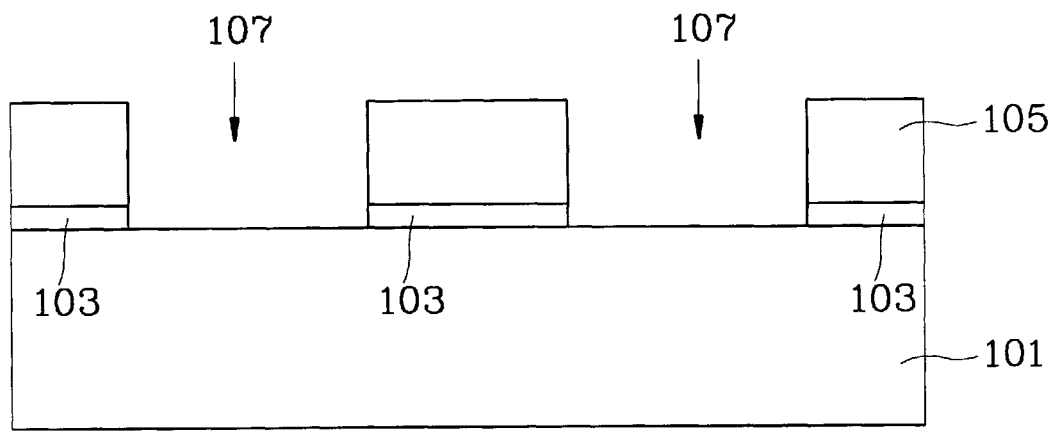
FIG. 2 is a cross-section view of forming isolation regions on the semiconductor substrate according to the embodiments of this invention.

In a method of increasing the thickness of field oxide layer according to a first embodiment of the present invention, a substrate 101 for a semiconductor integrated circuit is provided, as shown in FIG. 2. The substrate wafer is provided with a pad oxide layer 103, e.g., a layer of silicon dioxide formed by a conventional thineral oxidation method at an oxidation temperature above 900° C., and an overlying layer 105 of a mask material, e.g., silicon nitride (Si$_3$N$_4$) deposited by the low pressure chemical vapor deposition (LPCVD) process in which the reactants are SiH$_2$Cl$_{2(g)}$ and NH$_{3(g)}$ reacting at a temperature between 700–800° C. and a pressure between 0.1–1 torr. The thickness of said pad oxide layer 103 is about 200 Å–400 Å, and the thickness of said Si$_3$N$_4$ layer 105 is about 1300 Å–1700 Å.

The isolation regions 107 are defined on the substrate, e.g., by a conventional photoengraving step involving coating with photoresist, and patterning. Hereby a first photoresist is used to selectively remove the patterned silicon nitride mask 105 and the pad oxide layer 103, e.g., by a conventional known method of wet or dry etching, particularly by anisotropic plasma etching.

Figure 3:
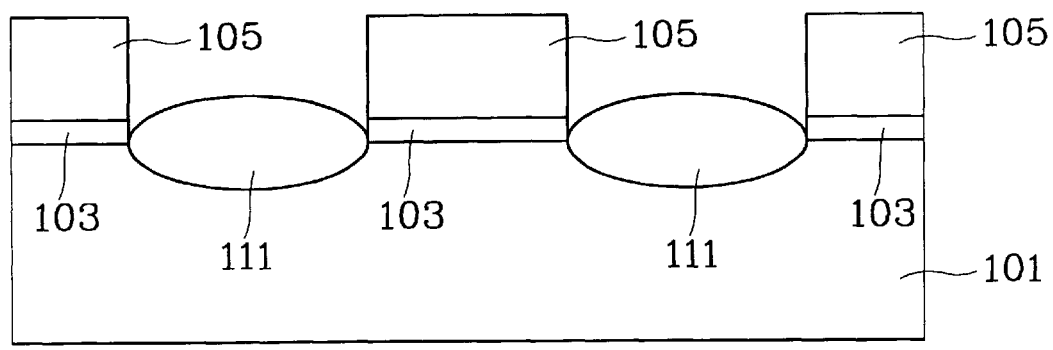
FIG. 3 is a cross-section view of a field oxide layer formed on a semiconductor substrate according to the embodiments of this invention.

Subsequently a field oxide layer 105 is formed at the isolation regions 107 for isolating active device regions from each other, as shown in FIG. 3, by a thermal oxidation process at an oxidation temperature above 900° C. The thickness of the field oxide layer is about 4000 Å–6000 Å.

Figure 4A:
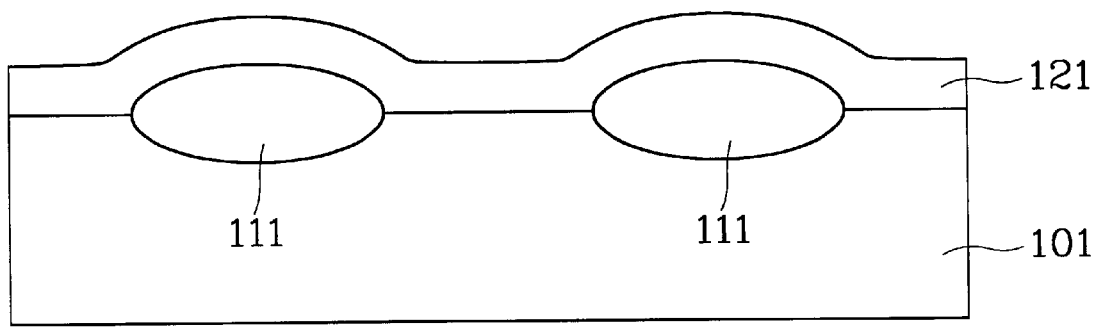
FIG. 4A is a cross-section view of a SiO$_2$ layer formed overlying the field oxide layer and the exposed regions of the substrate after removing the pad oxide layer and the Si$_3$N$_4$ mask according to the first embodiment of this invention.

Then, referring to FIG. 4A, the silicon nitride mask 105 and the pad oxide layer 103 are removed, and only the field oxide layer 111 is maintained on the substrate 101. A layer of silicon dioxide 121 is formed overlying the field oxide layer 111 and the exposed regions of the semiconductor substrate 101 by a method of chemical vapor deposition (CVD) in which the reactants include TEOS$_{(g)}$ reacting at a temperature between 650–750° C. and a pressure between 1–10 torr. The thickness of the layer of silicon dioxide 121 is about 2000 Å–4000 Å.

Figure 5:
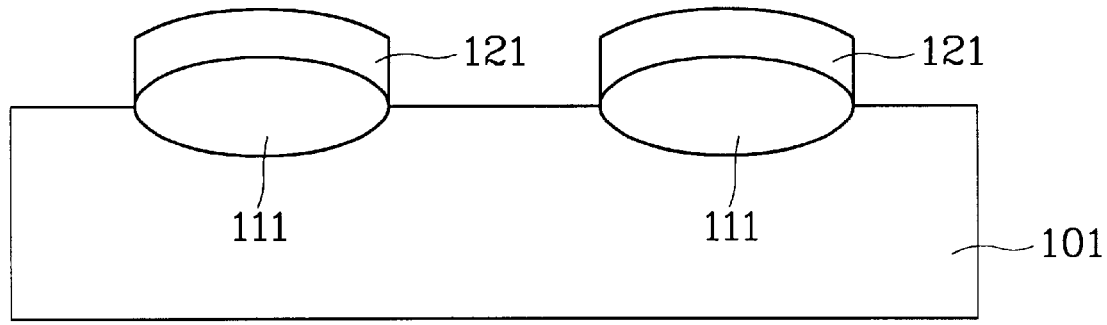
FIG. 5 is a cross-section view of increasing the thickness of field oxide layer by a SiO$_2$ layer according to the embodiments of this invention.

As shown in FIG. 5, the layer of silicon dioxide 121 is defined, e.g., by a conventional photoengraving step involving coating with photoresist, and patterning. Hereby a second photoresist is used to selectively remove the patterned layer of silicon dioxide 121, e.g., by a conventional known method of wet or dry etching, particularly by anisotropic plasma etching. Thus, the thickness of the field oxide layer 111 is increased by the residual silicon dioxide 121 without enlarging the bird's beak.

For the photoresists used in the present invention, if the first photoresist is a positive photoresist, then said second photoresist is a negative photoresist; or the first photoresist is a negative photoresist, then second photoresist is a positive photoresist. Thus, being able to use the same mask in both photoengraving steps can lower the manufacturing cost.

Figure 6:
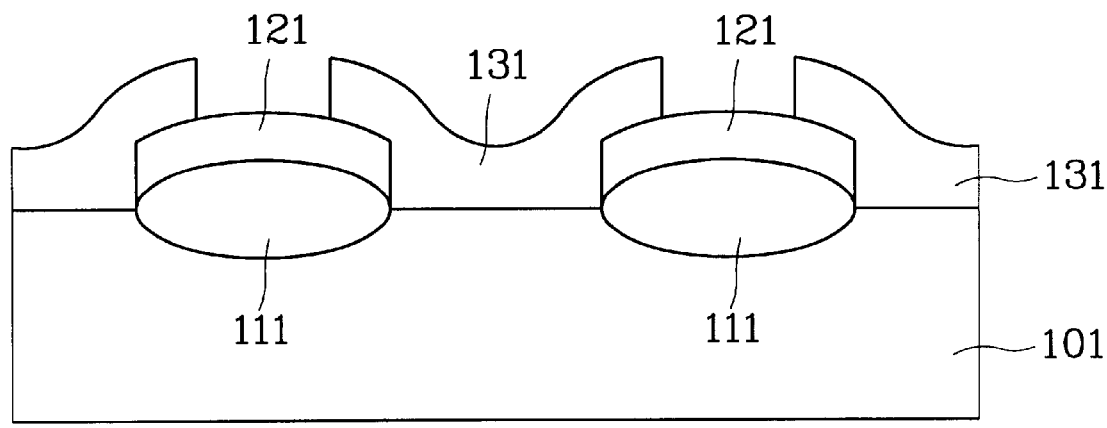
FIG. 6 is a cross-section view of forming the first polysilicon layer on the surface according to the embodiments of this invention.

Referring now to FIG. 6, a first polysilicon layer 131 and a gate oxide layer (not shown) are defined on the surface as a floating gate of the EEPROM. The first polysilicon layer 131 is formed by a method of LPCVD in which the reactants include silane (SiH$_{4(g)}$) reacting at a temperature between 600–650° C. and a pressure between 0.3–0.6 torr. The thickness of the first polysilicon layer 131 is about 1400 Å–2000 Å. An overlying layer (not shown) of a dielectric material, e.g., TiO$_2$, PbZr$_x$Ti$_{1-x}$O$_3$ (PZT), Ba$_x$Sr$_{1-x}$TiO$_3$ (BST), Ta$_2$O$_5$, or oxide/nitride/oxide (ONO), is deposited overall onto the surface as a dielectric layer between floating gate and control gate of the EEPROM. The thickness of the dielectric layer by using ONO is about 20 Å–100 Å.

Figure 7:
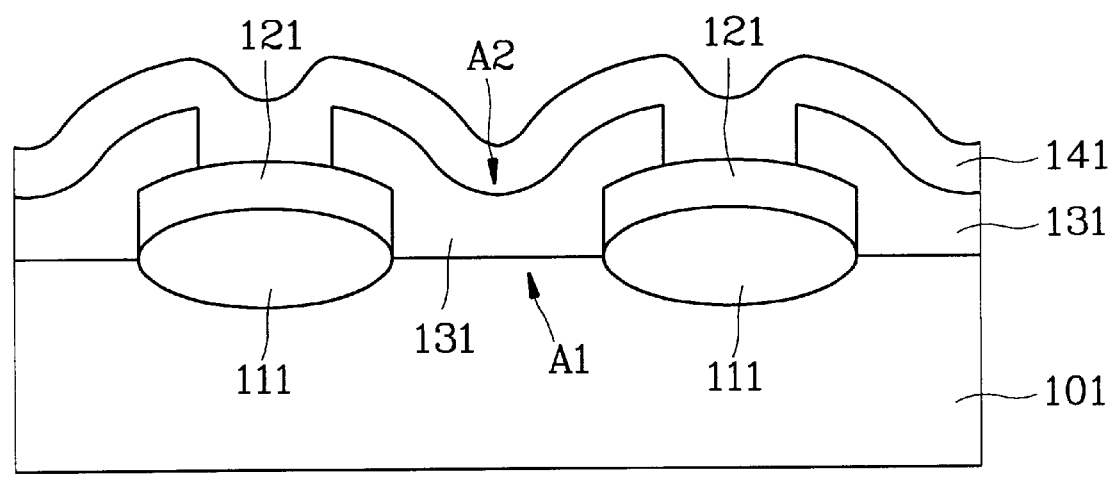
FIG. 7 is a cross-section view of forming the second polysilicon layer on surface the according to the embodiments of this invention.

As shown in FIG. 7, a second polysilicon layer 141 is defined on the surface as a control gate of the EEPROM. The second polysilicon layer 141 is formed by a same method as the first polysilicon layer 131 is formed, and its thickness is about 2000 Å–5000 Å. Thus, the process of making an EEPROM is finished.

In a method of increasing the thickness of field oxide layer according to another embodiment of the present invention, as shown in FIG. 2, a semiconductor substrate 101 is provided, as in the first embodiment. The substrate wafer is provided with a pad oxide layer 103, e.g. a layer of silicon dioxide formed by a conventional thermal oxidation method at an oxidation temperature above 900° C., and an overlying layer 105 of a mask material, e.g., silicon nitride deposited by the low pressure chemical vapor deposition (LPCVD) process in which the reactants are $SiH_2Cl_{2(g)}$ and $NH_{3(g)}$ reacting at temperature between 700–800° C. and a pressure between 0.1–1 torr. The thickness of said pad oxide layer 103 is about 200 Å–400 Å, and the thickness of said $Si_3N_4$ layer 105 is about 1300 Å–1700 Å.

The isolation regions 107 are defined on the substrate, e.g., by a conventional photoengraving step involving coating with photoresist, and patterning. Hereby a first photoresist is used to selectively remove the patterned silicon nitride mask 105 and the pad oxide layer 103, e.g., by a conventional known method of wet or dry etching, particularly by anisotropic plasma etching.

Subsequently, as in the first embodiment, a field oxide layer 111 is formed at the isolation regions 107 for isolating active device regions from each other (FIG. 3), by a thermal oxidation process at an oxidation temperature above 900° C. The thickness of the field oxide layer is about 4000 Å–6000 Å.

Figure 4B:
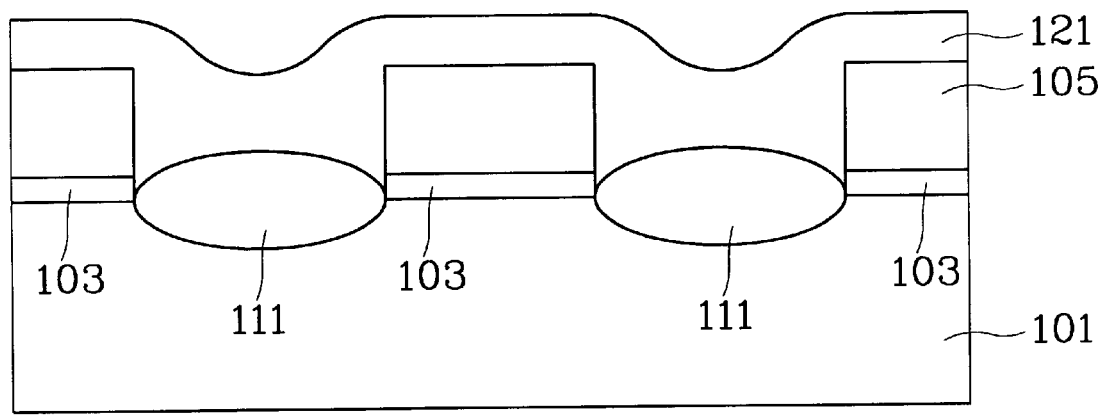
FIG. 4B is a cross-section view of a SiO$_2$ layer formed overlying the Si$_3$N$_4$ mask and the field oxide layer according to the second embodiment of this invention.

Then, referring now to FIG. 4B, a layer of silicon dioxide 121 is deposited overlying the $Si_4N_3$ layer 105 and pad oxide layer 111. The method of forming this silicon dioxide layer 121 is identical with the method described in the first embodiment.

As shown in FIG. 5, the layer of silicon dioxide 121 is defined, e.g., by a conventional photoengraving step involving coating with photoresist, and patterning. Hereby a second photoresist is used to selectively remove the patterned layer of silicon dioxide 121 by the same method as described in the first embodiment. Then, the $Si_4N_3$ layer 105 and pad oxide layer 111 are removed to achieve the objective of increasing the thickness of field oxide layer by the residual silicon dioxide 121 without enlarging the bird's beak.

Referring to FIGS. 6 and 7, as in the first embodiment, the first polysilicon layer 131 and the second polysilicon layer 141 are defined as a floating gate and a control gate of the EEPROM. Thus, the process of making an EEPROM is finished.

Figure 1:
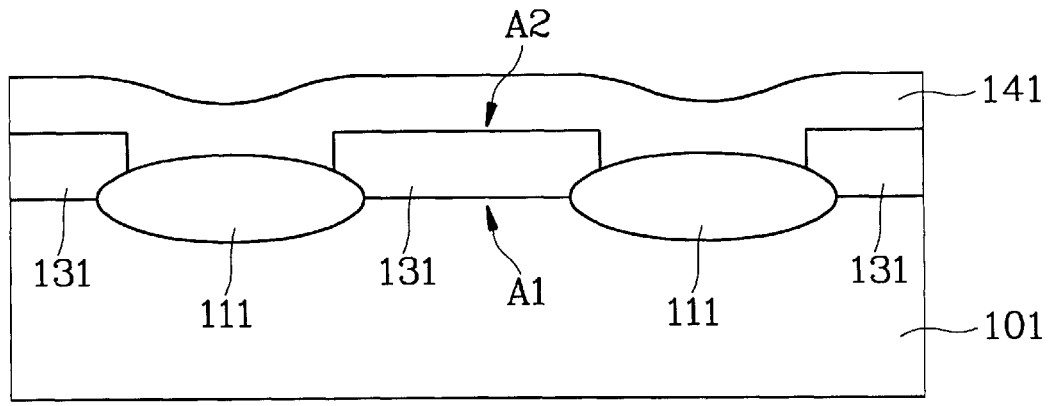
FIG. 1 is a cross-section view of an EEPROM formed according to the prior art.

Both embodiments described above are increasing the thickness of field oxide layer by overlying one more layer of silicon dioxide 121. The interface area A2 between the floating gate and the control gate are related to the Gate Coupling Ratio (GCR) of the EEPROM. The field oxide layer in FIG. 7 is thicker than it in FIG. 1, thereby the interface area A2 in FIG. 7 is larger than it in FIG. 1. Thus, to increase the thickness of the field oxide layer by the method exposed in the present invention can enlarge the area A2 that can effectively improve the GCR of the EEPROM.

It is to be understood that although the present invention has been described with reference to particular preferred embodiments, it should be appreciated that numerous modifications, variations and adaptations may be made without departing from the scope of the invention as defined in the claims.

What is claimed is:

1. A method of increasing the thickness of field oxide layer formed on a semiconductor substrate, comprising:

(a) forming a pad oxide layer on the semiconductor substrate;

(b) depositing a silicon nitride mask overlying said pad oxide layer;

(c) patterning said silicon nitride mask and said pad oxide layer to define isolation regions by using a first photoresist;

(d) removing said patterned silicon nitride mask and said pad oxide layer thereby exposing portions of said semiconductor substrate;

(e) forming field oxide layer at said isolation regions by thermal oxidation process;

(f) removing said silicon nitride mask and said pad oxide layer;

(g) forming a layer of silicon dioxide overlying said field oxide layer and said exposed portions of said semiconductor substrate;

(h) patterning said layer of silicon dioxide by using a second photoresist; and (i) removing said patterned layer of silicon dioxide to maintain the silicon dioxide overlying said field oxide layer.

2. The method as recited in claim 1, wherein said first photoresist is positive photoresist, and said second photoresist is negative photoresist.

3. The method as recited in claim 1, wherein said first photoresist is negative photoresist, and said second photoresist is positive photoresist.

4. The method as recited in claim 1, wherein the said field oxide layer has a thickness ranging from 4000 Å~6000 Å.

5. The method as recited in claim 1, wherein said layer of silicon dioxide is formed by using chemical vapor deposition (CVD).

6. The method as recited in claim 1, wherein the said layer of silicon dioxide has a thickness ranging from 2000 Å~4000 Å.

7. A method of increasing the thickness of field oxide layer formed on a semiconductor substrate, comprising:

(a) forming a pad oxide layer on the semiconductor substrate;

(b) depositing a silicon nitride mask overlying said pad oxide layer;

(c) patterning said silicon nitride mask and said pad oxide layer to define isolation regions by using a first photoresist;

(d) removing said patterned silicon nitride mask and said pad oxide layer thereby exposing portions of said semiconductor substrate;

(e) forming field oxide layers at said isolation regions by thermal oxidation process;

(f) forming a layer of silicon dioxide overlying said field oxide layer and said silicon nitride mask;

(g) patterning said layer of silicon dioxide by using a second photoresist;

(h) removing said patterned layer of silicon dioxide to maintain the silicon dioxide overlying said field oxide layer; and (i) removing said silicon nitride mask and said pad oxide layer.

8. The method as recited in claim 7, wherein said first photoresist is positive photoresist, and said second photoresist is negative photoresist.

9. The method as recited in claim 7, wherein said first photoresist is negative photoresist, and said second photoresist is positive photoresist.

10. The method as recited in claim 7, wherein the said field oxide layer has a thickness ranging from 4000 Å~6000 Å.

11. The method as recited in claim 7, wherein said layer of silicon dioxide is formed by using chemical vapor deposition (CVD).

12. The method as recited in claim 7, wherein the said layer of silicon dioxide has a thickness ranging from 2000 Å~4000 Å.

* * * * *